United States Patent [19]
Pendse

[11] Patent Number: 5,376,588
[45] Date of Patent: Dec. 27, 1994

[54] METHOD FOR MAKING HIGH PIN COUNT PACKAGE FOR SEMICONDUCTOR DEVICE

[76] Inventor: Rajendra D. Pendse, 5245 Diamond Common, Fremont, Calif. 94555

[21] Appl. No.: 198,723

[22] Filed: Feb. 18, 1994

Related U.S. Application Data

[62] Division of Ser. No. 988,640, Dec. 10, 1992.

[51] Int. Cl.$^5$ .................. H01L 21/56; H01L 21/60
[52] U.S. Cl. ............................ 437/211; 437/217; 437/220; 257/666
[58] Field of Search .............. 437/206, 209, 211, 217, 437/220; 257/668, 691, 693, 699, 700, 708, 775, 780, 673, 706

[56] References Cited

U.S. PATENT DOCUMENTS

| | | | |
|---|---|---|---|
| 4,881,116 | 11/1989 | Hidada et al. | 357/74 |
| 4,949,158 | 8/1990 | Ueda | 357/68 |
| 5,016,084 | 5/1991 | Nakao | 437/211 |
| 5,045,921 | 9/1991 | Lin et al. | 357/74 |
| 5,087,530 | 2/1992 | Wada et al. | 428/596 |
| 5,120,678 | 6/1992 | Moore et al. | 437/183 |
| 5,162,975 | 11/1992 | Matta et al. | 361/386 |

*Primary Examiner*—Olik Chaudhuri
*Assistant Examiner*—Long Pham

[57] ABSTRACT

A thermally and electrically enhanced surface mount package with up to at least 600 I/O connections, but possessing the flexibility and simplicity of conventional leadframes. The package includes an integrated circuit die having a plurality of bonding pads, a conductive substrate having a cavity formed therein for receiving the integrated circuit die, and a flexible circuit laminated on the conductive substrate. The flexible circuit includes at least a wiring pattern and an area array of bumps formed on pads at the periphery of the flexible circuit. The flexible circuit may include a plurality of openings through the flexible circuit beneath certain of the pads or traces of the wiring pattern so as to ground the certain of the pads (ground pads) or traces to the conductive substrate. Preferably, the lamination of the flexible circuit to the conductive substrate would be performed using a conductive adhesive which substantially fills the openings to facilitate the concomitant electrical connection of the ground pads to the conductive substrate. The package is advantageous because it provides excellent thermal performance and controlled impedance signal transmission which are important in packages having a high number of I/O connections, yet it is relatively inexpensive to produce, has a generic finger layout like leadframes, and lends itself to surface mount assembly by conventional pick-and-place and mass fellow techniques. A method for making the package is also disclosed.

3 Claims, 8 Drawing Sheets

METHOD FOR MAKING HIGH PIN COUNT PACKAGE FOR SEMICONDUCTOR DEVICE

CROSS REFERENCE TO RELATED APPLICATION

This is a divisional of copending application Ser. No. 07/988,640 filed on Dec. 10, 1992.

BACKGROUND OF THE INVENTION

1. Field of the Invention

The present invention relates to the field of integrated circuit packages, and more particularly, to surface mount packages having contacts arranged in a grid pattern (so called area array).

2. Description of the Related Art

Over the years, the electronics industry has minimized the size of integrated circuit chip designs. As integrated circuits become more dense and therefore smaller, the packaging of the integrated circuit becomes more complex. As a consequence, more and more input and output (I/O) connections become available for use with a single integrated circuit. For example, an integrated circuit with a size of 0.5 inches square can easily require 400 or more I/O connections.

The known packaging methods for low-cost standard integrated circuits having up to 300 I/O connections or so are not extendable to packages having more than 300 I/O connections. Presently, plastic quad flat packs (PQFPs) are the package type used for housing low cost high volume application specific integrated circuits (ASICs) having up to 300 I/O connections. The success achieved by PQFPs is attributable to their relative low-cost, which is based on high volume manufacturing that is achievable using conventional wire-bonding, leadframe and transfer molding technologies.

There are, however, a number of reasons why the PQFP packaging scheme is not suitable for packaging integrated circuits having more than 300 I/O connections. Namely, integrated circuits (e.g., ASICs) having more than 300 I/O connections typically produce a large amount of heat and utilize high frequency signal transmission. For example, an integrated circuit with 500 I/O connections might use 10 watts of power and operate at 100 MHz. However, QFPs cannot support frequencies in excess of 50 MHz because they lack a ground plane. Further, QFPs have difficultly in dissipating the heat produced by these highly integrated circuits due to their predominantly plastic body.

Another reason why PQFP packaging is not suitable for integrated circuits having more than 300 I/O connections is that the minimum pitch of outer leads of a leadframe is about 0.5 mm. These fine pitches cause problems with lead coplanarity and lead skew which result in a decrease in the surface mount assembly yield. A defect level in the 200 ppm (parts per million) range is not uncommon. In any event, as the number of I/O connections increases, finer pitches of the outer leads are required (i.e., below 0.5 mm) which accentuates these problems.

Still another reason is that as the number of I/O connections exceeds 300, the inner lead pitch needed drops below 8 mils. However, leadframe technology cannot provide an inner lead pitch below 8 mils. As a result, if QFPs are used, the package size would have to be increased so as to accommodate an enlarged leadframe. The enlarged leadframe would also require longer bonding wires to connect the chip pads to the inner leads. Even so, neither increasing package size nor increasing bonding wire length is acceptable to users.

However, a number of known integrated circuit packages, such as pin grid arrays, flip chip and TAB, are suitable for ICs having more than 300 I/O connections. The major problem of these packaging techniques is that they are a high end solution suitable for custom designs. That is, these packaging techniques typically cannot be implemented as standard, open-tooled, low-cost packages.

TAB refers to tape automated bonding which utilizes a continuous insulated tape which is similar to photographic film to produce a planer substrate for chips that are attached to individual sections, or frames, of the tape. A spider-like pattern of conductive traces is etched on each frame. An integrated circuit die is then carefully aligned over the center of the frame so that the contacts of the chip precisely match the conductive traces of the frame. The integrated circuit die can then be attached to the inner lead bonds of the TAB frame. Integrated circuits produced using the TAB technology can have conductive traces with a pitch of about 4 mils. These fine leads are attached to a printed circuit board (PCB) when the package is installed. Further, bumps are placed on the pads of the integrated circuit die. Alternatively, bumped TAB (BTAB) uses an interconnection method in which the bumps are not placed on the pads of the integrated circuit die, but on the thin copper foil.

Conventional TAB (i.e., one-metal TAB tape) has a problem in that it is unable to support high frequency signal transmission due to the lack of a ground plane. Although two-metal TAB tape is able to provide this feature, it is presently too expensive to be used in the packaging of standard integrated circuit parts. Furthermore, TAB tape has to be typically custom designed for each IC unlike leadframe technology.

Recent advances have produced demountable TAB (DTAB). DTAB is described in U.S. Pat. No. 5,162,975, entitled "Integrated Circuit Demountable TAB apparatus," which is commonly assigned with the subject application.

Flip chip is a technique in which a plurality of bumps in an area array arrangement on the integrated circuit die are mated with a matching pattern of pads on the substrate. The problem with flip chip is its high cost and lack of industry infrastructure and support. Pin grid arrays (PGAs) and land grid arrays (LGAs) are a family of customized multilayer ceramic or printed circuit package. The main drawback of PGAs and LGAs is that they typically require custom design and tooling specific to the integrated circuit and their costs fall above the QFP price curve ($0.10/pin vs. $0.02/pin). As a result, they are not a viable alternative for the QFP customer.

In sum, the known prior art fails to produce non-custom, low-cost surface mount packages which can facilitate over 300 I/O connections.

SUMMARY OF THE INVENTION

The present invention comprises a surface mount package in which a flexible circuit is laminated on a conductive body. The flexible circuit includes a wiring pattern which is connected to signal bonding pads of an integrated circuit die housed within the package. The flexible circuit may, for example, be a TAB frame or a printed circuit board. Ground bonding pads of the integrated circuit die are coupled to the conductive body via a ground bar or a wire-bondable finish on the conductive body.

Preferably, the flexible circuit also includes an area array of bumps at the outer periphery of the flexible circuit so as to provide up to at least 600 I/O connections. In addition, the flexible circuit may include openings through the flexible circuit beneath certain pads or traces of the wiring pattern so as to ground the certain pads (ground pads) or traces to the conductive body. It may also be preferable to laminate the flexible circuit on the conductive body using a conductive adhesive which substantially fills the openings during the lamination process. This electrically coupled, laminated structure of the flexible circuit and the conductive body may be envisioned as a "controlled impedance leadframe."

The present invention offers a number of benefits, including the following. The integrated circuit package according to the present invention can house integrated circuits having between 200–600 I/O connections. The integrated circuit package also has the beneficial characteristics of high thermal performance and controlled impedance signal transmission. Further, the integrated circuit package presents an exceptionally fine bonding pitch to the integrated circuit, with the potential to appreciably reduce the size of the chip in case of pad-limited integrated circuits.

In addition, the integrated circuit package according to the present invention has a low defect level during surface mount assembly. The integrated circuit package also does not have to be custom designed for every chip design but rather can be open-tooled and utilized much like the leadframe of QFP packages. In fact, it is conceivable that only three independent designs would cover the packaging needs of all possible integrated circuits in the 200–600 pin count range. Further, the present invention provides an integrated circuit package which has a low-cost ($0.02 per pin), approaching the cost of QFP's despite the enhancements in thermal and electrical performance as well as high pin counts.

BRIEF DESCRIPTION OF THE DRAWINGS

The present invention will be readily understood by the following description in conjunction with the accompanying drawings, wherein like reference numerals designate like structural elements, and in which.

DETAILED DESCRIPTION OF THE PREFERRED EMBODIMENTS

The inventor has developed an integrated circuit package which can provide up to 600 I/O connections. This integrated circuit package is relatively inexpensive to produce and can be surface mounted on printed circuit boards using conventional pick-and-place techniques. The integrated circuit package developed also has excellent thermal performance as well as high frequency signal transmission capability. These characteristics are required by packages having a high number of I/O connections.

Figure 1A:
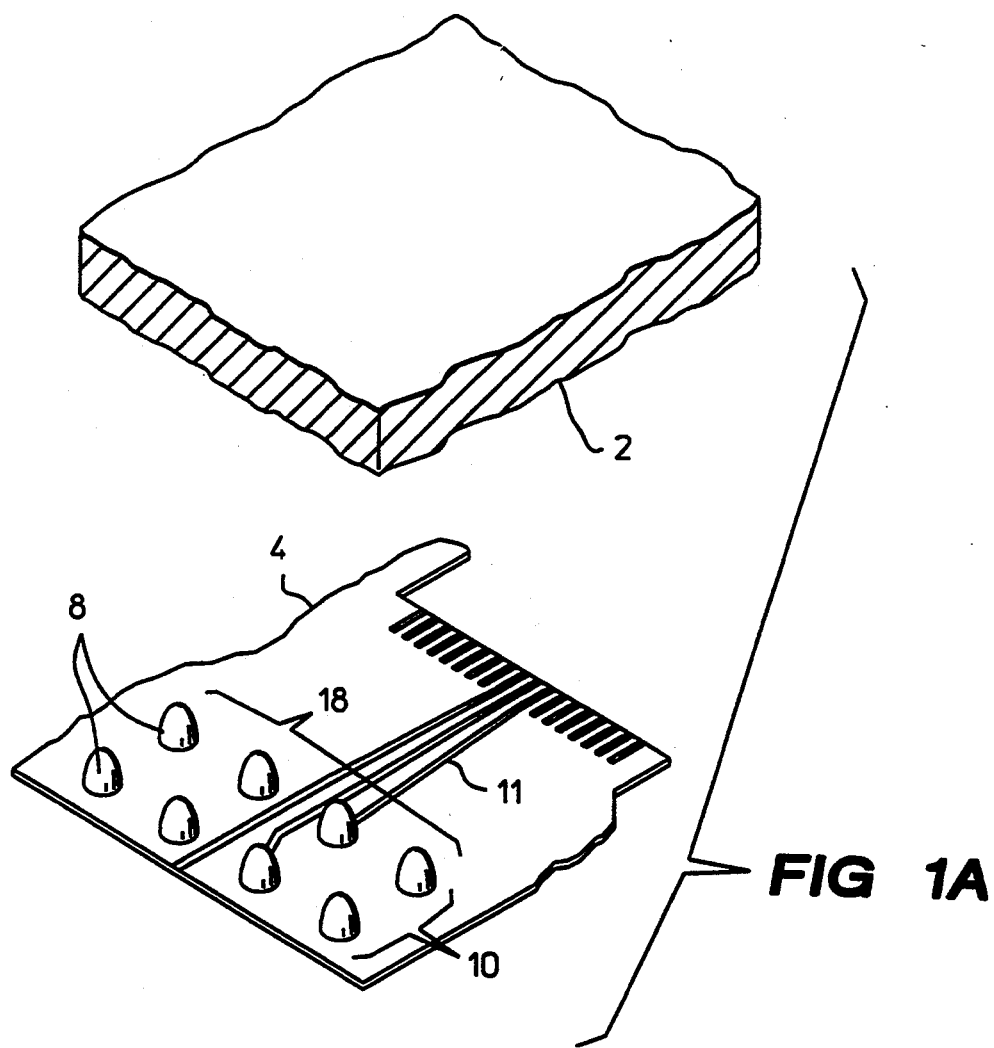
FIG. 1A is a perspective diagram illustrating use of area arrays of bumps to interconnect an integrated circuit die to a main printed circuit board.

FIG. 1A shows a main PCB 2 and a portion of a flexible circuit 4. The flexible circuit 4 is a wiring pattern (e.g., copper) on a thin ($\leq 4$ mils) dielectric 6 (e.g., polyimide). For example, the flexible circuit may be a TAB frame or a PCB. In addition, the outer periphery of the flexible circuit 4 contains solder bumps 8 arranged in an area array 10. These bumps 8 are used to interconnect the integrated circuit die to the main PCB 2 opening traces 11.

Figure 1B:
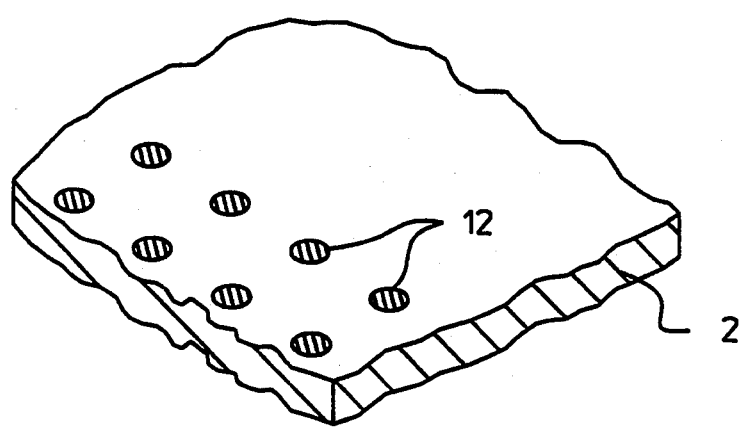
FIG. 1B is a diagram illustrating contacts on the main printed circuit board shown in FIG. 1A.

FIG. 1B illustrates the underside of the main PCB 2 shown in FIG. 1A. As shown, the main PCB 2 includes pads 12 arranged in an array (grid pattern) such that they are in positional alignment with the bumps 8 of the flexible circuit 4.

Figure 2:
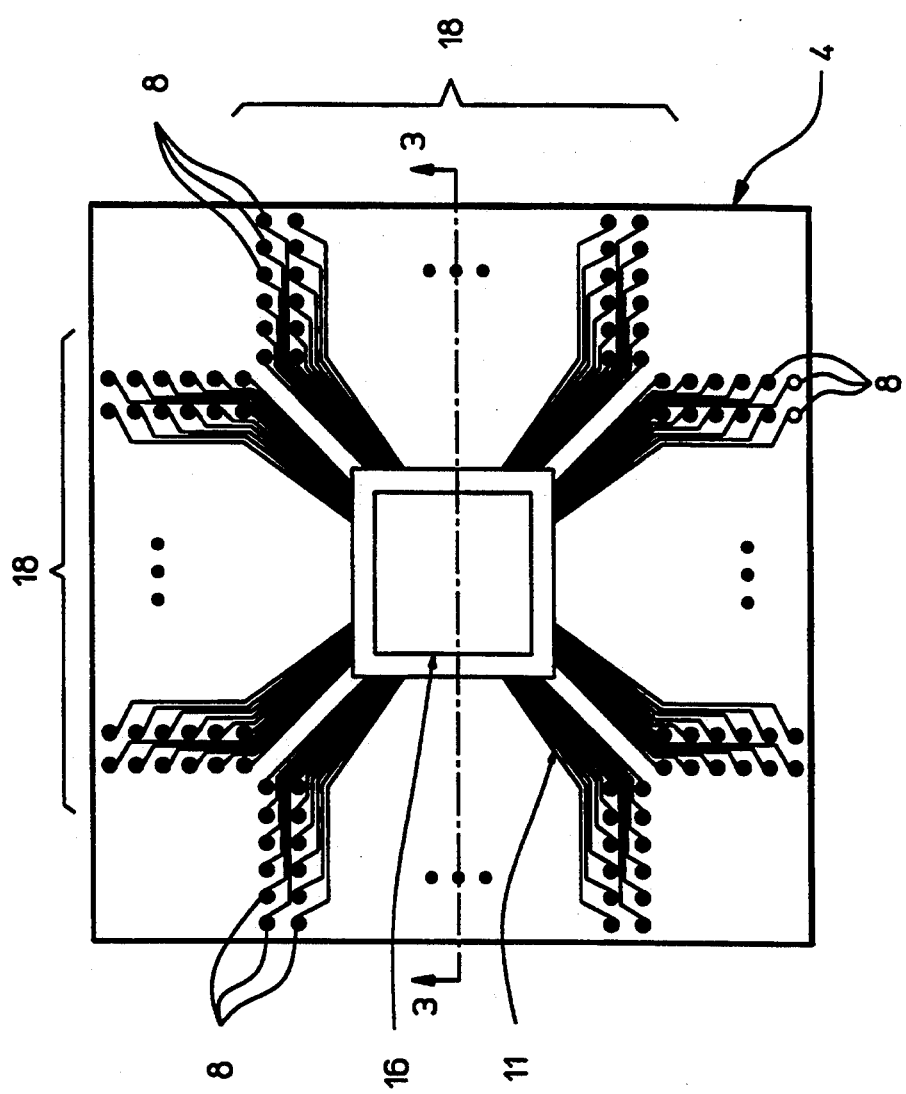
FIG. 2 is a top-view diagram illustrating a flexible circuit according to the present invention.

FIG. 2 is a top-view diagram illustrating a flexible circuit 4 according to the present invention. A ground bar 16 is shown extending around the circumference of the integrated circuit die or around the inner-periphery of the flexible circuit 4. As will be shown below, the ground bar 16 may be replaced by other means. The flexible circuit 4 replaces conventional leadframe technology.

An area array 18 is shown in FIG. 2 as having several hundred bumps 8 along the outer periphery of the flexible circuit 4. Each bump 8 corresponds to an I/O connection. As an example, if the flexible circuit 4 has the dimensions of 48 mm×48 mm, then about 600 usable I/O connections are available. More particularly, in FIG. 2, since the area array 18 is a two-dimensional array having six rows of bumps 8 deep and twenty-five columns of bumps 8 on each side of the area array 18, a total of 600 bumps 8 are provided. The number of rows and columns of the area array 18 is not critical.

It is important that the bumps 8 be configured in an array around the outer periphery of the flexible circuit 4. The area array 18 of bumps 8 facilitates the connection of a large number of I/O connections of an integrated circuit package to a main PCB. However, neither the total number of bumps 8 nor the number of rows and columns is critical. The invention is believed to be most useful for integrated circuit packages having 200–600 I/O connections.

Further, each of the bumps 8 needs not be connected to a trace 11. In particular, many of the bumps 8 of the area array 18 are provided for ground connections as opposed to signal connections. As will be more fully understood below, the bumps 8 acting as ground connections need not be connected to the integrated circuit die using the traces 11. Since traces 11 are not needed for the ground connections, the number and density of the wiring traces 11 is reduced. Moreover, it may even be desirable to use the outermost row of the bumps 8 around the periphery as ground connections.

Figure 3:
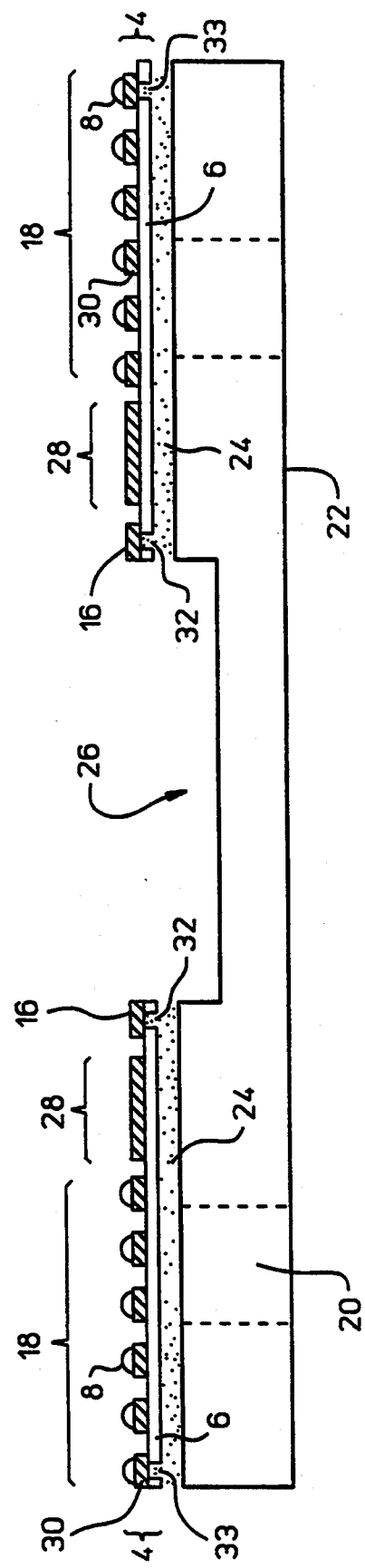
FIG. 3 is a cross-sectional diagram of the flexible circuit along the sectional line A—A' shown in FIG. 2.

FIG. 3 illustrates a cross-section of the flexible circuit 4 illustrated in FIG. 2. The flexible circuit 4 is laminated to a conductive substrate 22 using a conductive adhesive 24. The conductive substrate 22 is a metal body for the IC package. The conductive substrate 22 is preferably copper, although other materials such as aluminum and steel could be used. The conductive substrate 22 has a cavity 26 intended to house an integrated circuit die 28. The conductive substrate 22 with its cavity 26 is readily produced by known etching or stamping techniques.

On the top side of the flexible circuit 4 are certain wiring patterns 28, which include various traces 11. The traces 11 are connected to outer pads 30 which are configured in an area array (FIG. 2). The solder bumps 8 are formed on the outer pads 30. The wiring pattern 28 may optionally be connected to inner pads (not shown) formed on the inner periphery of the flexible circuit 4. Alternatively, the wiring patterns 28 may include inner leads for direct connection to the integrated circuit die as in a conventional TAB frame embodiment.

In FIG. 3, the ground bar 16 is electrically connected to the substrate 22 by way of inner openings 32 in the flexible circuit 4. Moreover, certain outer pads 30 (ground pads) in the area array 18 are electrically connected to the conductive substrate 22 by way of outer openings 33 in the flexible circuit. More particularly, inner openings 32 are formed beneath the ground bar 16 and the outer openings 34 are formed beneath ground pads in the area array 18 so as to couple the ground bar 16 and the ground pads to the conductive substrate 22. The conductive adhesive 24 also fills the inner openings 32 and the outer openings 33 when the flexible circuit 4 is laminated to the conductive substrate 22. As a result, the ground bar 16 and ground pads are electrically connected to the substrate 22 which operates as a ground plane for the integrated circuit. The ground plane operates so as to give controlled impedance to the traces 11.

Openings in the flexible circuit 4 may also be used to connect traces 11 to the conductive substrate 22. Hence, openings can be positioned under any portion of the wiring pattern 28.

Although FIG. 3 and embodiments discussed below make use of conductive adhesive 24 to facilitate the electrical connection of the ground pads and ground bar 16 to the conductive substrate 22, the use of conductive adhesive is not necessary in all cases. For example, if the openings 32, 33 are metal-plated vias, then electrical connection to the conductive substrate will occur without any conductive adhesive. Hence, a conventional PCB with plated vias could be used with the conductive adhesive. Also, it should be noted that the openings 32, 33 need only to extend through the dielectric portion of the flexible circuit 4, but may extend completely through the flexible circuit 4.

Figure 4:
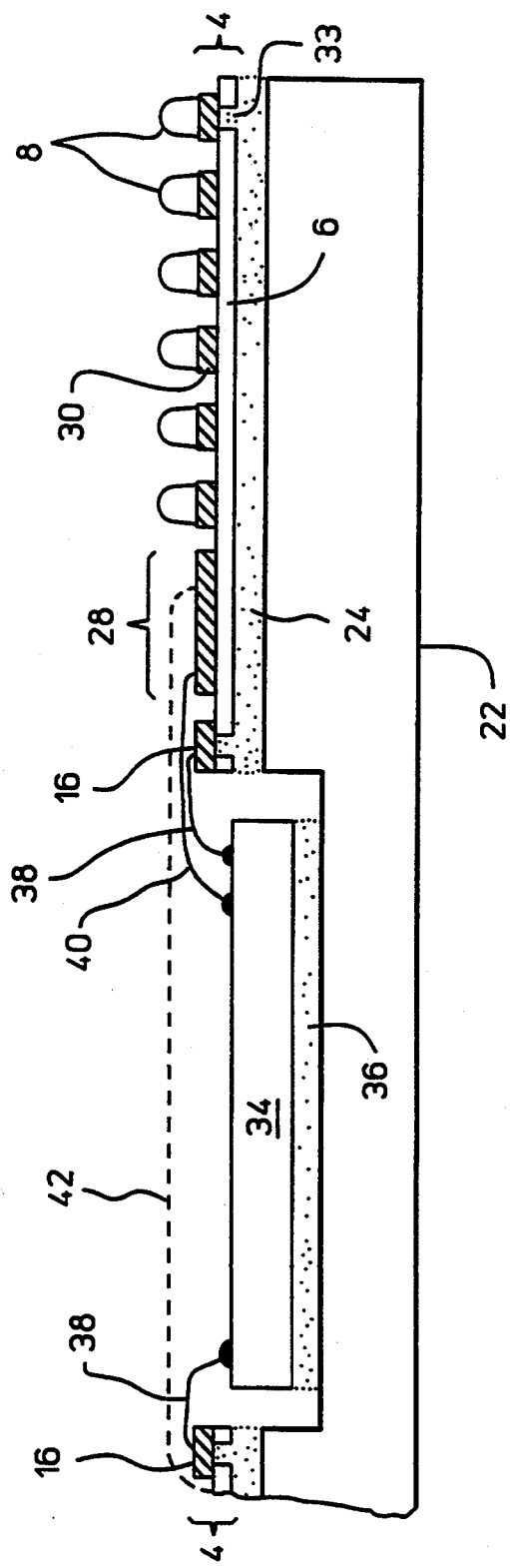
FIG. 4 is a partial cross-sectional diagram of an integrated circuit package according to a first embodiment of the present invention.

FIG. 4 illustrates a partial cross-sectional diagram of an integrated circuit package according to a first embodiment. In first embodiment, the flexible circuit 4 has a ground bar. In this embodiment, an integrated circuit die 34 is affixed to the substrate 22 within the cavity 26. As an example, the die 34 can be affixed to the substrate 22 using a conductive adhesive 36. The ground pad(s) of the integrated circuit die 34 are also wire-bonded to the ground bar 16 using wire 38. Specifically, the wire 38 connects the trace 28 (or pad) of the integrated circuit die 34 to the ground bar 16. Further, a wire 40 shown in FIG. 4 is exemplary of the many wires which are wire bonded between a pad of the integrated circuit die 34 and the traces 28 (or pad) on the flexible circuit 4.

After all of the pads of the integrated circuit die 34 have been connected to either the ground bar 16 or the traces 28, the integrated circuit die 34 and wires 38, 40 may be encapsulated in a polymer to protect the bonds from breakage. Preferably, an encapsulation layer 42 is of such a height that it will function as a stand-off from the main PCB 2 when the integrated circuit package is surface mounted to the main PCB 2.

Beneath several of the outer pads 30, which are to act as ground pads, are outer openings 33. The outer pads 30 which are directly above the outer openings 33 are electrically connected to the substrate 22 and, therefore, function as a ground pads. Again, the conductive adhesive 24 fills the outer opening 33, thereby facilitating the electrical connection to the conductive substrate 22.

Figure 5:
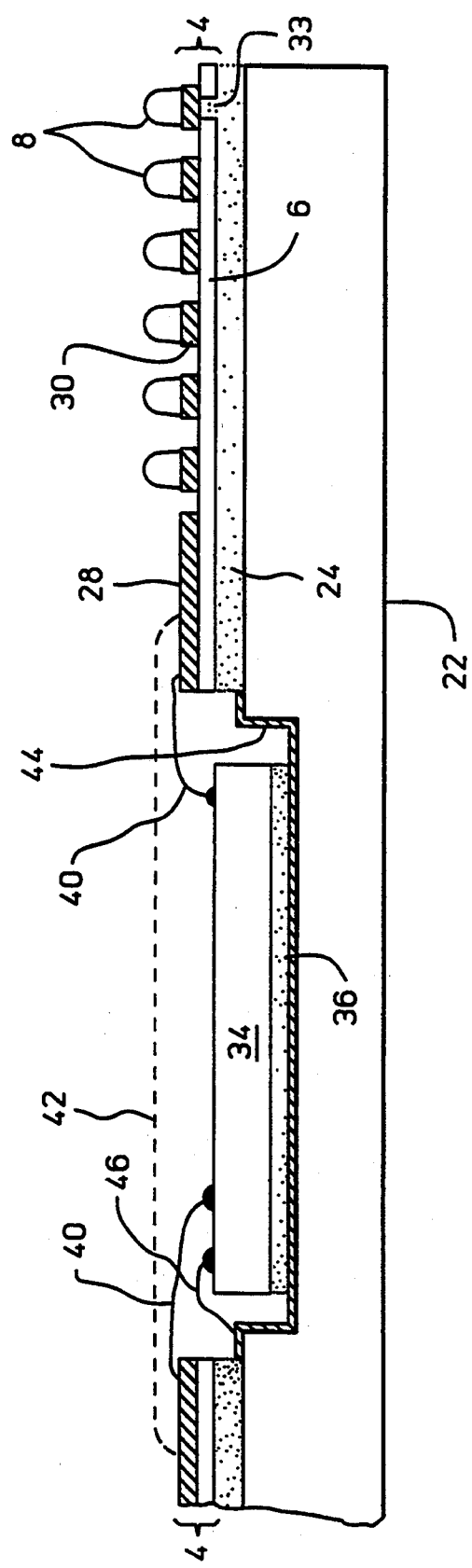
FIG. 5 is a partial cross-sectional diagram of an integrated circuit package according to a second embodiment of the present invention.

FIG. 5 illustrates a cross-sectional diagram of a second embodiment of the present invention. In this embodiment, the ground bar 16 is no longer present. Replacing the ground bar 16 is a spot-plate 44, which is a thin layer (50 $\mu$in.) of wire-bondable metal applied to the inner region of the substrate 22 in the substrate fabrication process. The wire-bondable metal is, for example, silver, gold or nickel. The spot-plate 44 need only be on the lip of the cavity 26 in the conductive substrate 22.

The ground pads of the integrated circuit die 34 are then down-bonded directly to the spot-plate 44 on the lip of the cavity 26 using wires 46. Thus, the embodiment shown in FIG. 5 is essentially the same as that shown in FIG. 4 with the exception of the manner in which the ground pads of the integrated circuit die 34 are grounded to the substrate 22.

Figure 6:
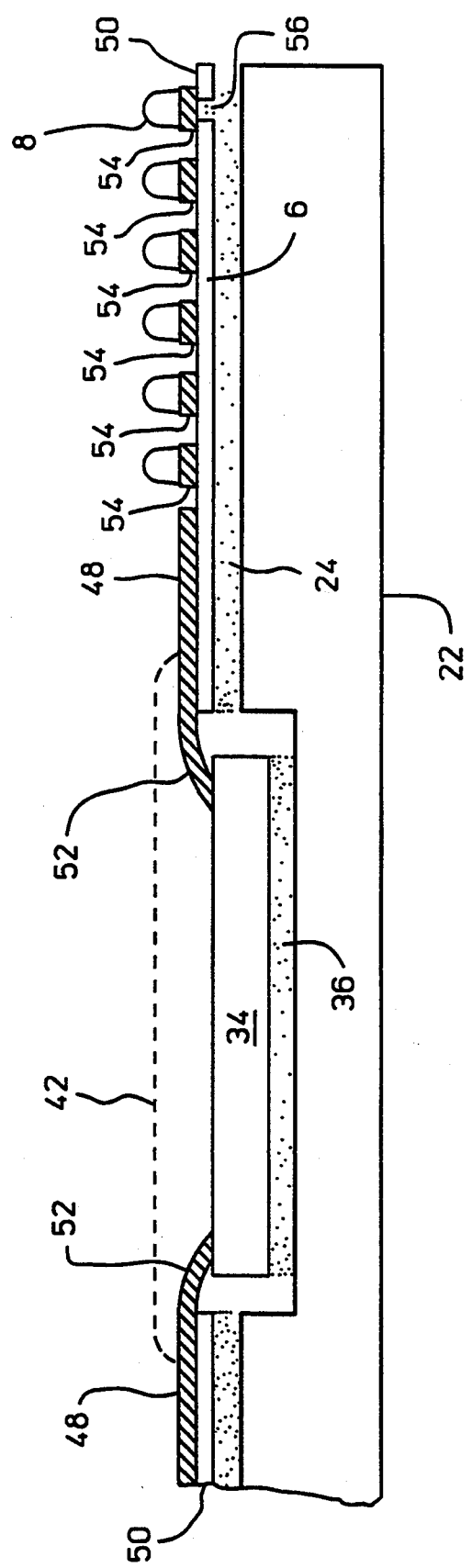
FIG. 6 is a partial cross-sectional diagram of an integrated circuit package according to a third embodiment of the present invention.

FIG. 6 illustrates a cross-sectional diagram of a third embodiment of the present invention. In this embodiment, the flexible circuit 4 relates to a conventional TAB frame. The TAB frame 4 has a foil layer 48 and a polymer backing 50 and is laminated to the substrate 22 using the conductive adhesive 24. Inner leads 52 of the TAB frame 4 are coupled to the bonding pads of the integrated circuit die 34 as is conventionally done using TAB, e.g., thermosonic or thermocompression bonding.

Like the previous embodiments, outer pads 54 of the TAB frame 4 contain solder bumps 8 formed thereon along the outer periphery of the integrated circuit package in the configuration of an area array 18. Moreover, several of the outer pads 54 of the TAB frame 4 are ground pads. The outer pads 54 which operate as ground pads are coupled to the substrate 22 using outer openings 56 formed in the polymer backing 50. The conductive adhesive 24 fills the outer openings 56 so as to electrically connect the outer pads 54 operating as ground pads to the substrate 22.

Figure 7:
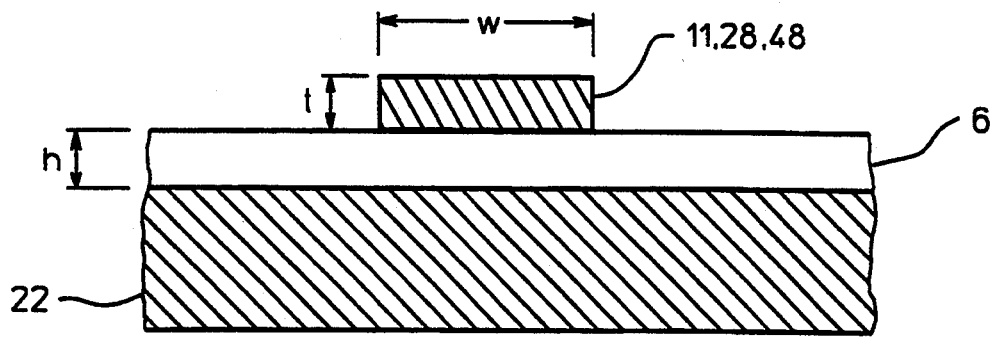
FIG. 7 is a detailed diagram depicting a microstrip controlled impedance signal environment achieved by a typical package construction.

The substrate 22 of the present invention operates not only as a ground plane but also as a heat spreader. As a result, the integrated circuit package can operate at high frequencies and provide excellent thermal management. FIG. 7 illustrates a microstrip controlled impedance transmission line. Specifically, as depicted in FIG. 7, when signal trace width w is 0.002" (copper), dielectric height h is 0.002" (polyimide, $\epsilon = 3.4$), and signal trace thickness is 0.0014", the ground plane (copper substrate) provides an approximately 50 ohm controlled impedance signal environment without kinks or antennas in the signal traces, as depicted in FIG. 7. The controlled impedance enables the package to operate at frequencies exceeding 100 MHz. Also, the thermal conductivity of the substrate 22 functions to dissipate the heat generated by the integrated circuit package. The dissipation of heat is an ever increasing problem of high density integrated circuits.

Optionally, a two-metal TAB frame may be utilized with the present invention. In such case, the outer openings 56 would not be required because the second metal of the TAB frame 4 would appear on the underside of the TAB frame 4, thus facilitating the coupling of the ground pads to the substrate 22. Typically, the second metal of the TAB frame 4 is a copper layer.

Figure 8:
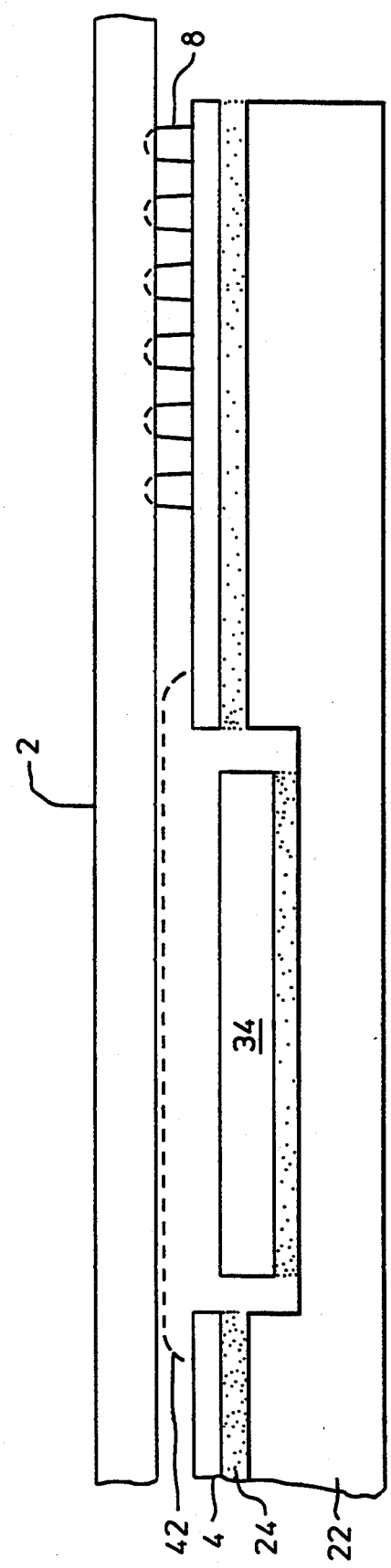
FIG. 8 is a perspective diagram illustrating interconnection of the integrated circuit package to a main printed circuit board.

FIG. 8 illustrates a perspective diagram which shows the interconnection of the integrated circuit package to the main PCB 2. In particular, the flexible circuit 4, having bumps 8 contained on the outer periphery thereof, is mounted onto the main PCB 2 using conventional pick and place machines. As shown in FIG. 1B, the main PCB 2 contains pads 12 on its under side. These pads 12 are arranged in a grid pattern so as to align and contact with the bumps 8. Any conventional solder reflow process in a typical surface mount assembly operation can be used to melt the solder of the bumps 8 so as to provide a reliable electrical connection between the outer pads 30, 54 of the flexible circuit 4 and the contacts 12 of the main PCB 2.

During the reflow process, the height of the solder bumps 8 will decrease. As a result, it is important to prevent the main PCB 2 from contacting the surface of the flexible circuit 4. This can be elegantly obtained by the encapsulation layer 42 which covers the integrated circuit die 34. That is, by applying the encapsulation layer 42 with an appropriate height, the encapsulation layer 42 can provide a natural stand-off for the flexible circuit 4, thus preventing the undesirable contact.

Figure 9:
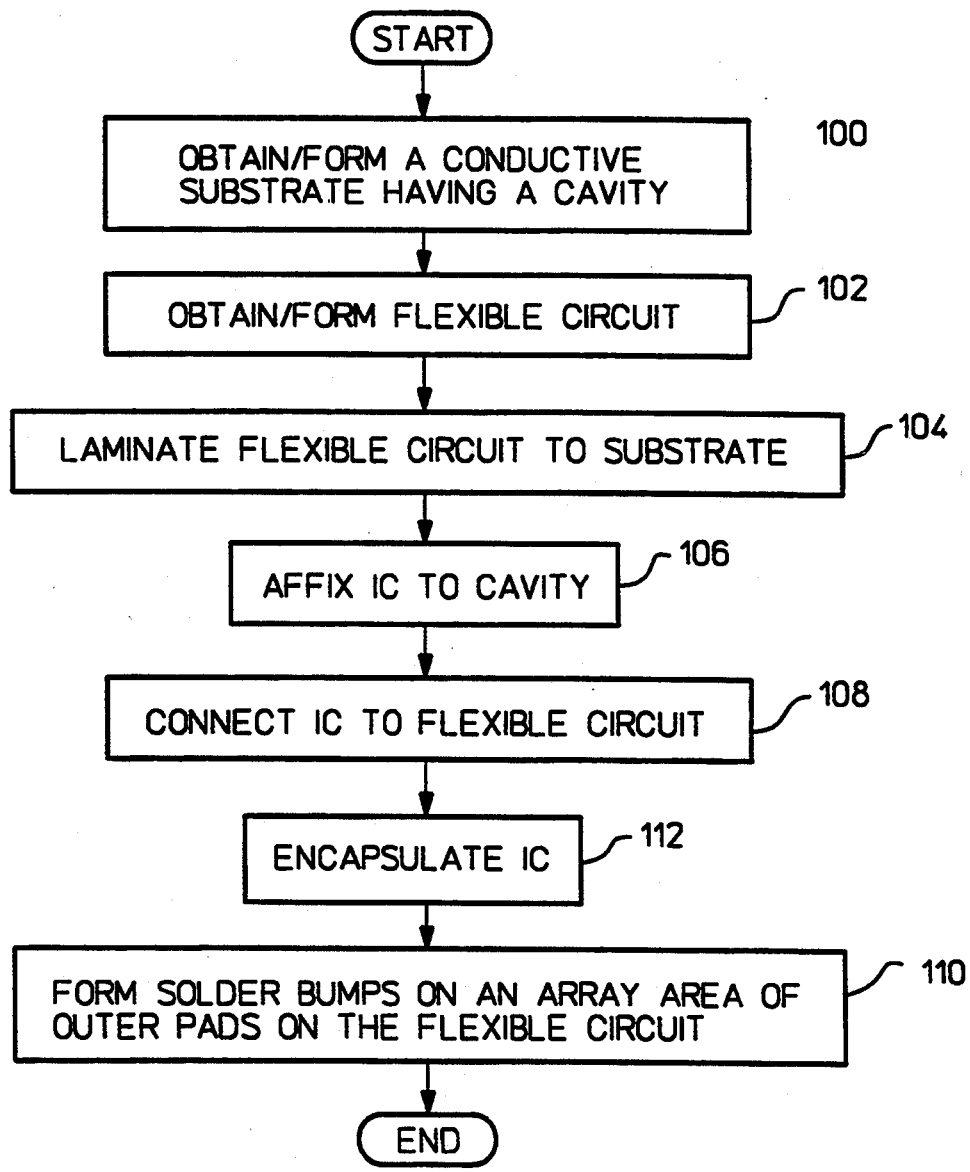
FIG. 9 is a flow chart illustrating a process for making an integrated circuit package according to the present invention.

FIG. 9 illustrates a flow chart of a process for making the integrated circuit package according to the present invention. The process begins by forming a conductive substrate 22 with its associated cavity 26 (step 100) and forming the flexible circuit 4, which includes at least a wiring pattern 28 and an array area 18 of outer pads (step 102). Preferably, several openings 32, 33, 56 are provided through at least the dielectric portion of the flexible circuit 4 beneath certain of the outer pads which function as ground pads.

Thereafter, the flexible circuit 4 is laminated to the substrate 22 with conductive adhesive (step 104) as follows. A layer of adhesive is applied to the flexible circuit 4. Preferably, the layer of adhesive not only substantially coats the bottom surface of the flexible circuit 4 but also substantially fill the openings. The flexible circuit 4 is then placed in contact with the substrate 22 and the adhesive is cured under heat and pressure to complete the lamination.

The integrated circuit die 34 is then attached to the cavity 26 (step 106) using thermally conductive adhesive 36. This thermally conductive adhesive 36 may also be electrically conductive if the back of the integrated circuit die itself is to be grounded. Next, the integrated circuit die 34 is connected to the wiring pattern of the flexible circuit (step 108). As discussed above, this step may be performed by conventional techniques, such as wire bonding. An encapsulation layer 42 is provided to cover the integrated circuit die 34 and the wire bonds (step 110). Finally, solder bumps are then formed on the area array 18 of outer pads on the flexible circuit 4 (step 112).

Most of the benefits of the invention discussed above (e.g., high pin count, reduced package size, improved thermal performance, controlled impedance transmission) may be directly realized by the present invention. However, other of the objects may only be indirectly realized by the present invention, and therefore, require a brief discussion. Namely, the present invention facilitates a low defect level during surface mount assembly because it lends itself to surface mounting using conventional pick-and-place and many reflow techniques. Conventional TAB cannot be manufactured using pick-and-place techniques because of its thin, fine leads. Further, the present invention provides a low cost, high pin count packaging solution because it is able to make use of TAB (one-metal) and PCB, which are products of low cost, high volume manufacturing technologies. Moreover, the present invention requires only a single layer of wiring, thus no multi-layer routing is necessary. Hence, the present invention provides a very generic package design which eliminates the need to custom design the package for every integrated circuit die. As a result, the present invention is able to provide a cost effective package for integrated circuits having a large number of I/O connections.

The many features and advantages of the present invention are apparent from the detailed invention and thus it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for packaging an integrated circuit, comprising the steps of:
    (a) obtaining a conductive substrate;
    (b) obtaining a flexible circuit having a wiring pattern, an area array of outer pads, and a plurality of openings through the flexible circuit beneath at least one of certain of the outer pads of the area array and certain traces of the wiring pattern;
    (c) laminating the flexible circuit on the conductive substrate using adhesive disposed therebetween;
    (d) affixing the integrated circuit to the cavity of the conductive substrate;
    (e) electrically connecting the integrated circuit with the wiring pattern of the flexible circuit; and
    (f) forming solder bumps on the outer pads of the area array.

2. A method as recited in claim 1, wherein said laminating step (c) comprises the steps of:
    (c1) applying a layer of conductive adhesive to a bottom surface of the flexible circuit which not only substantially covers the bottom surface but also fills the openings; and
    (c2) laminating the flexible circuit having the conductive adhesive applied thereto to the conductive substrate, whereby the flexible circuit is affixed to the conductive substrate and the certain of the outer pads of the area array or the certain traces above the openings are electrically connected to the conductive substrate.

3. A method as recited in claim 1, wherein the integrated circuit includes signal bonding pads and ground bonding pads, wherein said obtaining step (a) obtains the conductive substrate having a cavity for receiving the integrated circuit and a wire-bondable finish on at least a region surrounding the cavity, and wherein said method further comprises step (g) wire down-bonding ground pads of the integrated circuit to the wire-bondable finish.

* * * * *